United States Patent
Vajapey et al.

[11] Patent Number: 5,877,647
[45] Date of Patent: Mar. 2, 1999

[54] CMOS OUTPUT BUFFER WITH SLEW RATE CONTROL

[75] Inventors: Sridhar Vajapey, Sugarland; Luat Q. Pham, Houston, both of Tex.

[73] Assignee: Texas Instruments Incorporated, Dallas, Tex.

[21] Appl. No.: 732,549

[22] Filed: Oct. 15, 1996

Related U.S. Application Data

[60] Provisional application No. 60/005,466 Oct. 16, 1995.

[51] Int. Cl.$^6$ ............... H03K 17/16; H03K 19/0948; H03K 3/013
[52] U.S. Cl. .................. 327/391; 327/384; 327/112; 327/170; 326/27; 326/58; 326/87
[58] Field of Search ............... 326/87, 91, 26, 326/27, 58, 82, 83, 86; 327/170, 108, 111, 112, 379, 380, 381, 384, 387, 391, 389

[56] References Cited

U.S. PATENT DOCUMENTS

| | | | |
|---|---|---|---|
| 4,820,942 | 4/1989 | Chan | 327/310 |
| 5,063,308 | 11/1991 | Borkar | 326/26 |
| 5,122,690 | 6/1992 | Bianchi | 326/27 |
| 5,153,457 | 10/1992 | Martin et al. | 326/27 |
| 5,166,555 | 11/1992 | Kano | 326/87 |
| 5,319,260 | 6/1994 | Wanlass | 326/21 |
| 5,332,932 | 7/1994 | Runaldue | 326/82 |
| 5,426,376 | 6/1995 | Wong et al. | 326/27 |
| 5,534,791 | 7/1996 | Mattos et al. | 326/27 |
| 5,537,060 | 7/1996 | Baek | 326/87 |
| 5,568,062 | 10/1996 | Kaplinsky | 326/58 |
| 5,708,386 | 1/1998 | Chow | 327/380 |

*Primary Examiner*—Timothy P. Callahan
*Assistant Examiner*—Terry L. Englund
*Attorney, Agent, or Firm*—Gerard E. Laws; Robert D. Marshall, Jr.; Richard L. Donaldson

[57] ABSTRACT

An output buffer 10 of an integrated circuit controls the slew rate of an output signal in order to minimize electromagnetic interference. Transient current delay circuits 132 and 134 provide a delay between turning off pull down circuit 122 and turning on pull up circuit 124, and vice versa, in order to assure that driver overlap does not occur. Pull up circuit 124 selectively switches a plurality of output transistors P(n) in order to control the rise time of an output signal. Likewise, pull down circuit 122 selectively switches a plurality of output transistors N(n) in order to control the fall time of an output signal so that current spikes on supply lines to output buffer 10 are reduced or eliminated.

7 Claims, 5 Drawing Sheets

5,877,647

CMOS OUTPUT BUFFER WITH SLEW RATE CONTROL

This is a provisional application Ser. No. 60/005,466 filed Oct. 16,1995.

FIELD OF THE INVENTION

This invention relates to integrated circuits and to reducing Electromagnetic Interference in systems comprising integrated circuits.

BACKGROUND OF THE INVENTION

Advances in integrated circuit (IC) technology has resulted in shrinking the channel lengths of metal-oxide-semiconductor (MOS) transistors which increases the switching speed of these transistors. Heightened governmental regulation is reducing the electro-magnetic interference (EMI) allowance which may be generated by an electronic system. Furthermore, systems require increased electro-static discharge (ESD) tolerance. As the channel length is reduced, the transistors get faster and conduct more current. Increasing transistor width or holding the widths to pre-shrink sizes means that the peak source and sink capability of the transistors in an IC output buffer is increased. This directly increases the amount of electromagnetic radiation which contribute to EMI and also increase the chances of latchup in the output buffer. Furthermore, for the same drive requirements the output driver transistor can be smaller which may result in ESD protection being compromised.

In a prior art buffer, when the buffer is enabled and an output terminal transitions from a LOW to a HIGH or a HIGH to LOW, output capacitance (parasitic or otherwise) which is connected to the output terminal is suddenly charged or discharged. This may cause a large amount of current to flow through the power and ground lines. Due to internal device routing line resistance and printed circuit board (PCB) trace resistance on the power and ground lines, the following conditions may happen:

i) the voltage on the power line tends to dip momentarily during a low to high transition of the output; and ii) the voltage on the ground line rises momentarily during a high to a low transition on the output.

Both the conditions (i) and (ii) above are undesirable for the reasons listed below:

a) If the voltage dips below a diode drop from power line (VCC), there could be large substrate currents therefore increasing the chances of a latchup;

b) If the voltage rises above a diode drop from ground line (VDD) there could be substrate currents again increasing the chances of a latchup; and c) Even if sufficient precautions were taken to prevent above conditions, the dip/rise on the power/ground lines radiates noise.

A strong output transistor has a low characteristic impedance. Typically, an impedance mismatch occurs between the output transistor and the printed circuit board traces which results in ringing. FIG. 1 illustrates an output signal 102 of a typical prior art output buffer which has overshoot/ringing 104 and undershoot/ringing 106. Ringing contributes to EMI and is therefore undesirable. Prior art FIG. 1 also illustrates output current 107 of a typical prior art output buffer which has current spikes 108 and 109. Current spikes 108 and 109 may cause undesirable fluctuations on power and ground.

With the EMC radiation regulation requirements getting more and more difficult to meet, it becomes a requirement to create more innovative circuits. Accordingly, there is needed an output buffer which overcomes these EMI and ESD problems.

Other objects and advantages will be apparent to those of ordinary skill in the art having reference to the following figures and specification.

SUMMARY OF THE INVENTION

An integrated circuit has an output buffer which has a plurality of output transistors which are turned on and off in response to time delays and predetermined threshold voltages such that transient currents and ringing of an output signal is minimized. Imposing a delay between turn-off and turn-on of output transistors prevents short circuit transient current from flowing from a VCC supply terminal to a VDD return terminal and therefore eliminates noise associated with such transient currents. Selective turn on of output transistors prevents large output current spikes which may result in noise on the supply terminals and reduces or eliminates ringing of the output signal.

BRIEF DESCRIPTION OF THE DRAWINGS

Other features and advantages of the present invention will become apparent by reference to the following detailed description when considered in conjunction with the accompanying drawings, in which.

Corresponding numerals and symbols in the different figures refer to corresponding parts unless otherwise indicated.

DETAILED DESCRIPTION OF PREFERRED EMBODIMENTS OF THE INVENTION

This invention addresses the design of output and input/output buffers in a semiconductor device, especially semiconductor devices that are intended to interface with logic devices or electromechanical devices such as lamps or sensors. The output buffer/driver is designed so that both the slew rate and the amount of transient current generated during switching of the output signal are controlled to minimize EMI while not affecting the overall performance such as drive capability and ESD protection required for normal applications.

It has been determined that EMI contributed by an output buffer can be significantly reduced so as to meet stringent application and in some cases governmental regulations:

1. Minimizing or eliminating the short circuit currents in the output buffer caused during switching of the output signal from HIGH to LOW and from LOW to HIGH. This minimizes the amount of electrical noise injected onto the power and ground lines and thereby minimizes the amount of EMI radiated from the power and ground lines and conducted out through associated PCB traces.

2. Switching the output stage in a manner such that the charge required to switch the output signal from HIGH to LOW and from LOW to HIGH is transferred slowly enough to prevent significant dips on the power line or pulses on the ground line. This is an aspect of slew rate control and achieves the objective of minimizing/eliminating noise on the power and ground lines.

3. Switching the output transistors in a manner which controls the rise and fall time of the output signal so that over-shoot/under-shoot and subsequent ringing is prevented or minimized. This is another aspect of slew rate control and achieves the objective of minimizing/eliminating noise on the output signal line.

Aspects of the novel methods which have been invented to accomplish this are included in the embodiment which will now be described in detail.

Figure 1:
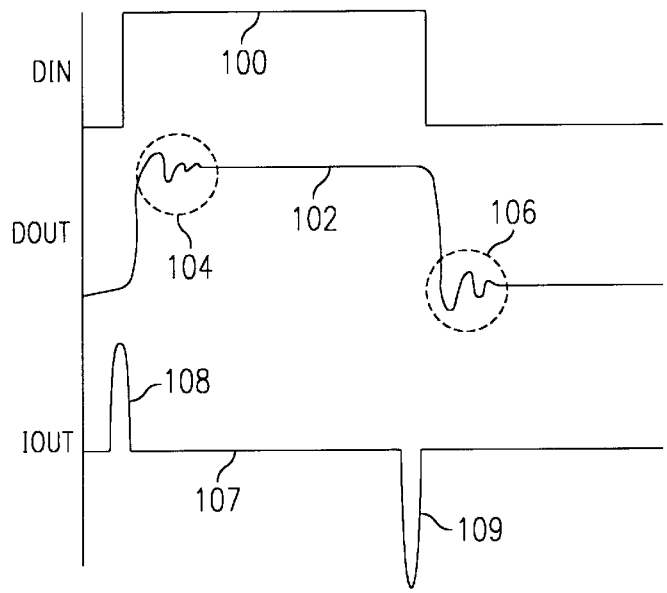
FIG. 1 is a timing diagram of a prior art device showing ringing current spikes on an output terminal which contributes to EMI.
Figure 2:
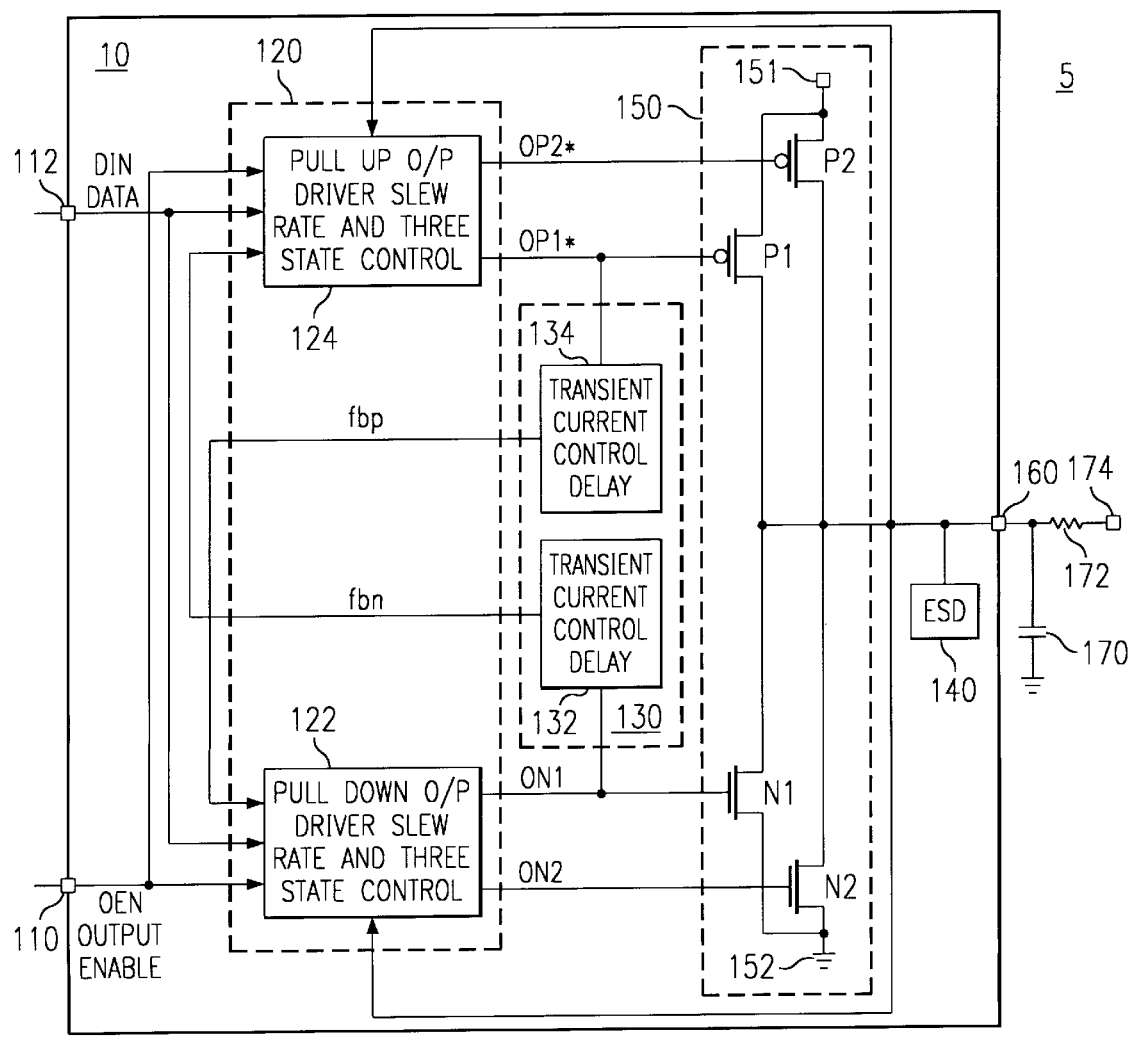
FIG. 2 is a block diagram of an output buffer having slew control according to the present invention.

FIG. 2 is a block diagram of an output buffer 10 having slew rate control according to the present invention. Buffer 10 is disposed as part of integrated circuit 5. An output terminal 160 provides an output signal to an external system in response to an input signal placed on input terminal 112. An output enable signal on enable terminal 110 controls whether output terminal 160 is in an active state or a high impedance standby state (tri-state output). Slew rate control 120 comprises pull-down control 122 and pull-up control 124. Transient control 130 comprises pull-up delay 132 and pull-down delay 134. Output stage 150 comprises transistors P1, P2, N1 and N2. ESD protection 140 comprises known means for preventing damage to an output buffer from electrostatic energy injected on terminal 160.

The external system which is connected to terminal 160 will typically include a capacitive load 170 and a resistive load 172. Resistive load 172 may be variable, such as with a tungsten lamp. A current 162 may flow from output 160 to capacitive load 170 and to terminal 174. Terminal 174 may have a voltage connected to it from another source.

The circuit is designed to do the following:
When not enabled:
enable terminal 110=HIGH,
output terminal 160=Three-state (or High Z condition)
When enabled:
enable terminal 110=LOW,
output terminal 160=input terminal 112.

Figure 3:
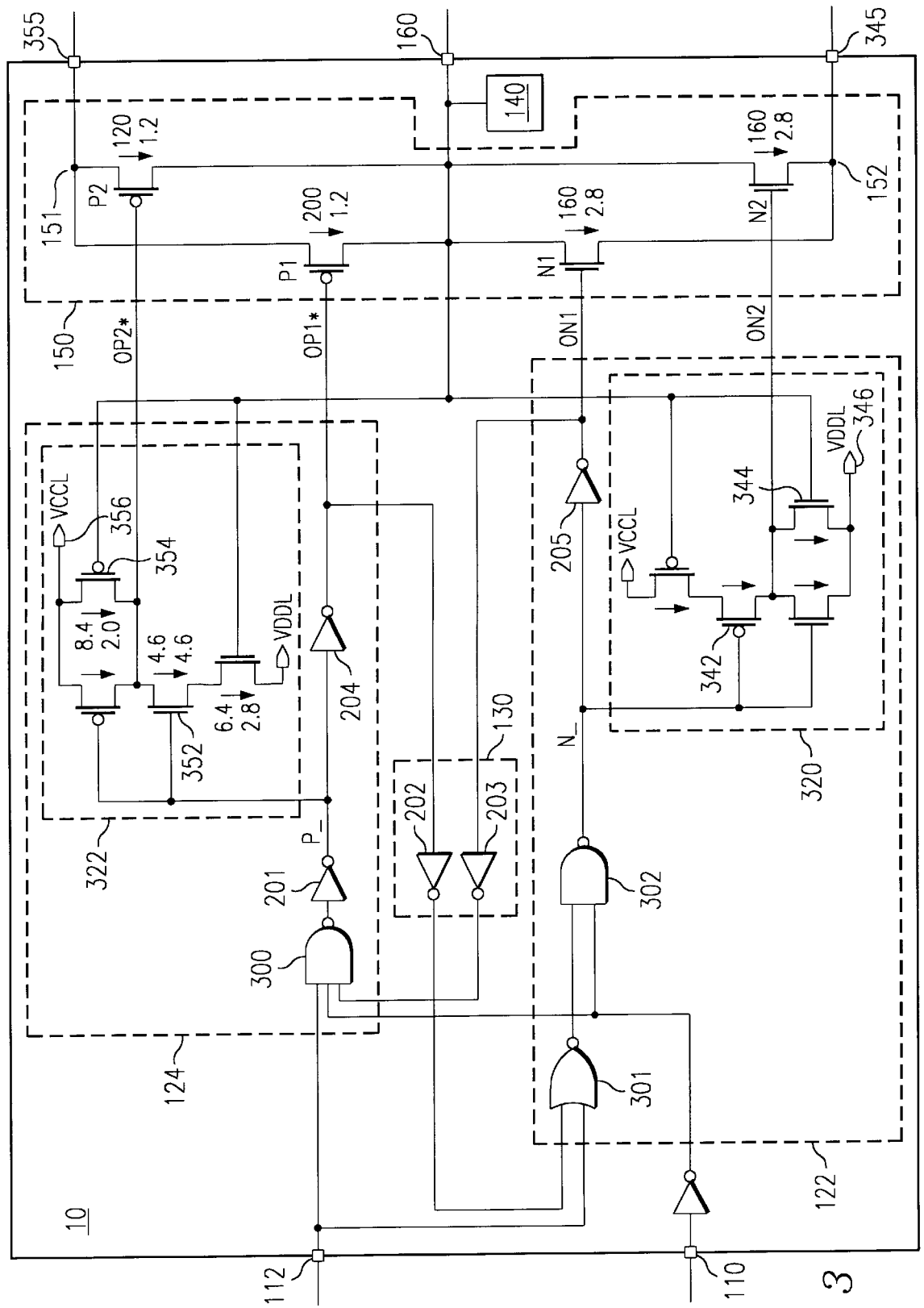
FIG. 3 is a schematic of a portion of the output buffer of FIG. 2 showing details of the slew rate control circuitry and output transistors.

FIG. 3 is a schematic of the output buffer 10 of FIG. 2 showing details of the slew rate control circuitry 122 and 124, transient control 130, and output stage 150. Slew rate control 122 and 124 cause the characteristic impedance of output stage 150 to vary with time so that ringing and current spiking in the signal on output terminal 160 is minimized or eliminated. Transient control 130 is made of appropriately sized inverters 202 and 203 that add just the required amount of delay so that both the P and N output transistors are not enabled at the same time. This is to minimize or eliminate transient, or short circuit, currents which would flow from VCC terminal 355 to VDD terminal 345 if both P and N output transistors were enabled at the same time. Output stage 150 comprises PMOS transistors P1 and P2 and NMOS transistors N1 and N2. The width (w) and channel length (l) of each transistor determines its current carrying capacity which affects switching time. Output transistors P1 and P2 are sized so that the current carrying capacity of each transistor is less than the rated output source current of buffer 10. Likewise, output transistors N1 and N2 are sized so that the current carrying capacity of each transistor is less than the rated output sink current of buffer 10.

Transient control 130 operates as follows. When input terminal 112 is switched from LOW to HIGH, control signals ON1 and ON2 are driven to a logical LOW, referred to as deasserted, turning off transistors N1 and N2. NAND gate 300 combines the signal on input terminal 112 and enable terminal 110 and the output of feedback inverter 203. The output of NAND 300 is inverted by inverter 201 and then re-inverted by inverter 204 to form control signal OP1*. (The * indicates that a signal is logically inverted.) The output of inverter 201 is also connected to level detector 322 which forms control signal OP2*. Control signal OP1* is connected to the gate of output transistor P1 and control signal OP2* is connected to the gate of output transistor P2. Feedback inverter 203 insures that the output of NAND 300 is delayed until signal ON1 and ON2 are deasserted so that output transistors P1 and P2 cannot be turned on until a short time after output transistors N1 and N2 are turned off.

Likewise, when input terminal 112 is switched from HIGH to LOW, control signals OP1* and OP2* are deasserted (actually, a high voltage), turning off transistors P1 and P2. NOR gate 301 and NAND gate 302 combine the signals on input terminal 112 and output enable terminal 110 and the output of feedback inverter 202. The output of NAND gate 302 is inverted by inverter 205 to form control signal ON1. The output of NAND gate 302 is also sent to level detector 320 which forms control signal ON2. Control signal ON1 is connected to the gate of output transistor N1 and control signal ON2 is connected to the gate of output transistor N2. Feedback inverter 202 insures that the output of NAND 302 is delayed until signal OP1* and OP2* are OFF so that output transistors N1 and N2 cannot be turned on until a short time after output transistors P1 and P2 are turned off.

Slew rate controls 122 and 124 operate to selectively switch the output transistors. During the switching of a signal on output terminal 160 from HIGH to LOW, PMOS transistors P1 and P2 are first shut off. After a short delay induced by transient control 130, NMOS transistors N1 and N2 are turned on to discharge output terminal 160. However, the turn-on of transistor N2 is delayed for a period of time after the turn-on of transistor N1. This causes the output voltage on terminal 160 to drop in a controlled rate initially. After the output voltage on terminal 160 drops to a predetermined voltage, transistor N2 will be turned on and lowers the output impedance of output stage 150 so that a lower output voltage can be maintained on output terminal 160. This causes the output voltage on terminal 160 to drop in a fairly linear manner for an extended period of time. Thus, the charge on output capacitance 170 which is connected to terminal 160 is transferred to VDD terminal 345 in an advantageously controlled manner. Controlling the drive capability of output stage 150 in this manner reduces or eliminates undershoot and ringing on terminal 160.

Likewise, during a transition of output terminal 160 from a LOW to a HIGH, transistors N1 and N2 are first shut off. After a short delay induced by transient control 130, transistors P1 and P2 are turned on to charge output terminal 160. However, the turn-on of transistor P2 is delayed for a period of time after the turn-on of transistor P1. After the voltage on output terminal 160 reaches a predetermined voltage, transistor P2 is turned on and lowers the output impedance of output stage 150 so that a higher output voltage can be maintained on output terminal 160. This causes the output voltage on terminal 160 to raise in a fairly linear manner for an extended period of time. Thus, output capacitance 170 which is connected to terminal 160 is charged from VCC terminal 355 in an advantageously controlled manner. Controlling the drive capability of output stage 150 in this manner reduces or eliminates overshoot and ringing on terminal 160.

Specifically, when a signal on input terminal 112 is switched from HIGH to LOW, the output of NAND 302 goes LOW after a short delay, as described above. Control signal ON1, the output of inverter 205, goes to a logical HIGH, referred to as "asserted," in response to NAND 302 and turns on output transistor N1. Control signal ON1 remains asserted as long as input terminal 112 is LOW and enable terminal 110 is LOW. Level detector 320 senses the voltage on output terminal 160 and compares this voltage to the VDDL supply voltage on terminal 346, typically ground. When the voltage on output 160 drops to a predetermined low threshold voltage, transistor 344 turns off and transistor 342 turns on, thus causing signal ON2 to be asserted which turns on output transistor N2. The predetermined low threshold voltage is determined by the gain of transistor 344, and is set at approximately 2 volts above the voltage on terminal 346.

Likewise, when a signal on input terminal 112 is switched from LOW to HIGH, the output of inverter 201 goes HIGH after a short delay, as described above. Control signal OP1*, the output of inverter 204, is asserted and turns on output transistor P1. Control signal OP1* remains asserted as long as input terminal 112 is HIGH and enable terminal 110 is LOW. Level detector 322 senses the voltage on output terminal 160 and compares this voltage to the VCCL supply voltage on terminal 356, typically approximately 5 volts. When the voltage on output 160 rises to a predetermined high threshold voltage, transistor 354 turns off and transistor 352 turns on, thus causing signal OP2* to be asserted which turns on output transistor P2. The predetermined high threshold voltage is determined by the gain of transistor 354, and is set at approximately 2 volts below the voltage on terminal 356.

Thus, according to the present invention, one output transistor is turned on to begin switching the voltage on terminal 160 from HIGH to LOW in a controlled manner, and a second output transistor is turned on once the voltage on terminal 160 reaches a predetermined low threshold voltage. By reducing the slew rate, switching current is advantageously reduced and undershoot is advantageously minimized or eliminated. Likewise, according to the present invention, one output transistor is turned on to begin switching the voltage on terminal 160 from LOW to HIGH in a controlled manner, and a second output transistor is turned on once the voltage on terminal 160 reaches a predetermined high threshold voltage. Again, by reducing the slew rate, switching current is advantageously reduced and overshoot is advantageously minimized or eliminated.

Figure 4:
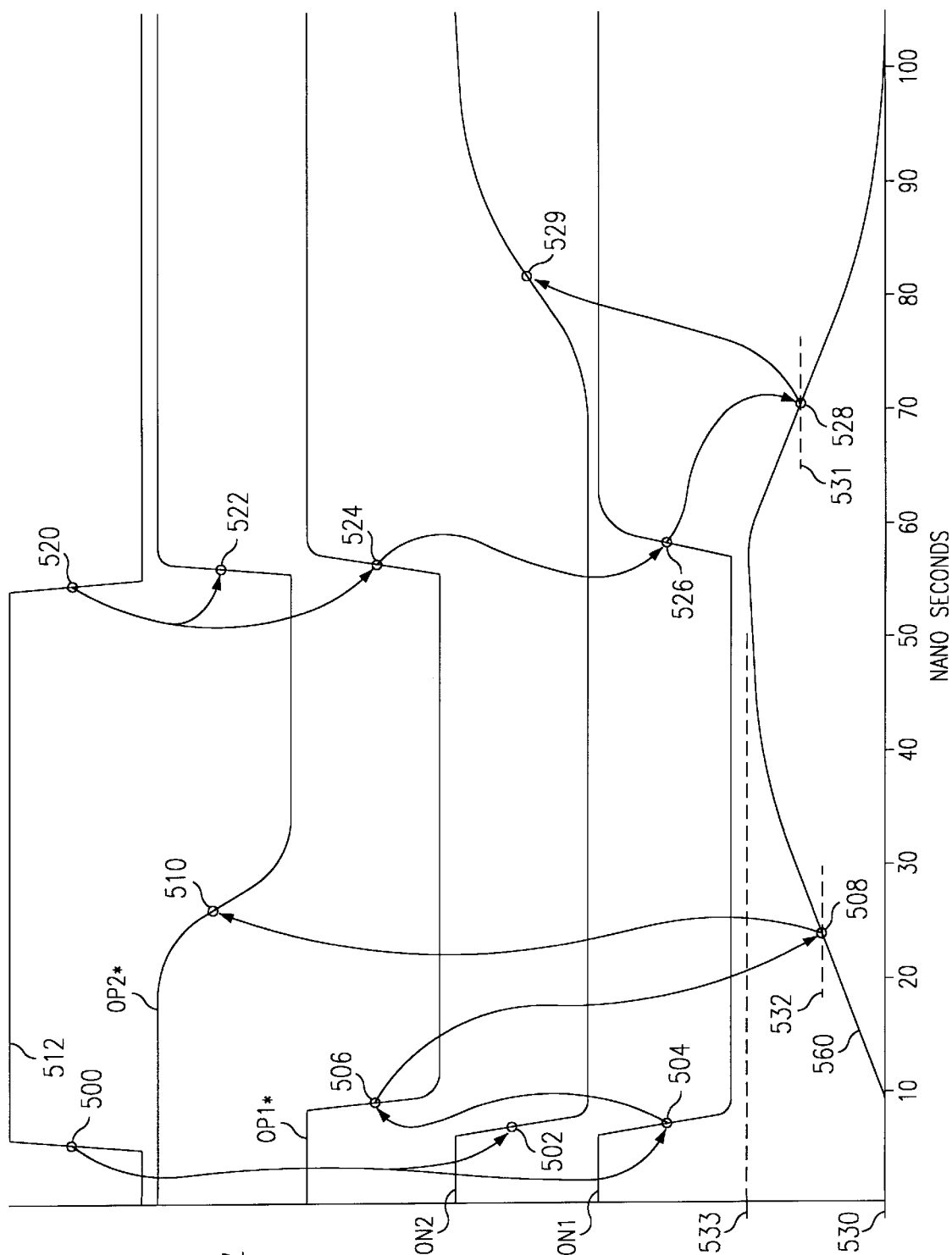
FIG. 4 is a timing diagram of the output buffer of FIG. 2 showing the output signal and various control signals.

FIG. 4 is a timing diagram of the output buffer of FIG. 2 showing the output signal on terminal 160 and various control signals. FIG. 4 illustrates several of the beneficial aspects of the present invention, as described above. In FIG. 4, signal 512 is the input signal on terminal 112. Control signals OP1*, OP2*, ON1 and ON2 are the control signals described above. Signal 560 is the voltage on output terminal 160. Voltage level 533 is the approximate HIGH voltage level, while voltage level 530 is the approximate LOW voltage level. Voltage level 532 is the predetermined high threshold voltage and voltage level 531 is the predetermined low threshold voltage.

At time 500, input signal 512 is switched HIGH which causes ON1 and ON2 to be deasserted at times 504 and 502, respectively. Time 502 and 504 are approximately the same time, but may vary due to various circuit delays. According to a feature of the present invention, control signal OP1* is not asserted until a slight delay later at time 506 to prevent transient, or short circuit, current from flowing from VCC terminal 355 to VDD terminal 345. According to another feature of the present invention, control signal OP2* is delayed until time 508 to reduce the slew rate of output signal 560 and minimize noise on VCC terminal 355. At time 508, signal 560 has reached high threshold voltage 532 and according to a feature of the present invention, control signal OP2* is asserted to turn on transistor P2 in order to reduce the impedance of output stage 150. This allows a required output high current, I(oh), to be sourced from terminal 160 at voltage level 533. From time 510 until time 520, transistors P1 and P2 are both turned on to maximize the current sourcing capacity of terminal 160. Controlling the rise time of signal 560 in this manner also minimizes overshoot of signal 560.

At time 520, input signal 512 is switched LOW, which causes a similar sequence to be repeated. Control signals OP1* and OP2* are deasserted at times 524 and 522. Time 522 and 524 are approximately the same times, but may vary due to various circuit delays. According to a feature of the present invention, control signal ON1 is delayed until time 526 to prevent transient current. Control signal ON2 is delayed until time 528 to reduce the slew rate of signal 560. At time 528, signal 560 has reached low threshold voltage 531 and according to a feature of the present invention, control signal ON2 is asserted to turn on transistor N2 in order to reduce the impedance of output stage 150. This allows a required output low current, I(ol), to be sunk by terminal 160 at voltage level 530. Controlling the fall time of signal 560 in this manner also minimizes undershoot of signal 560.

Figure 5:
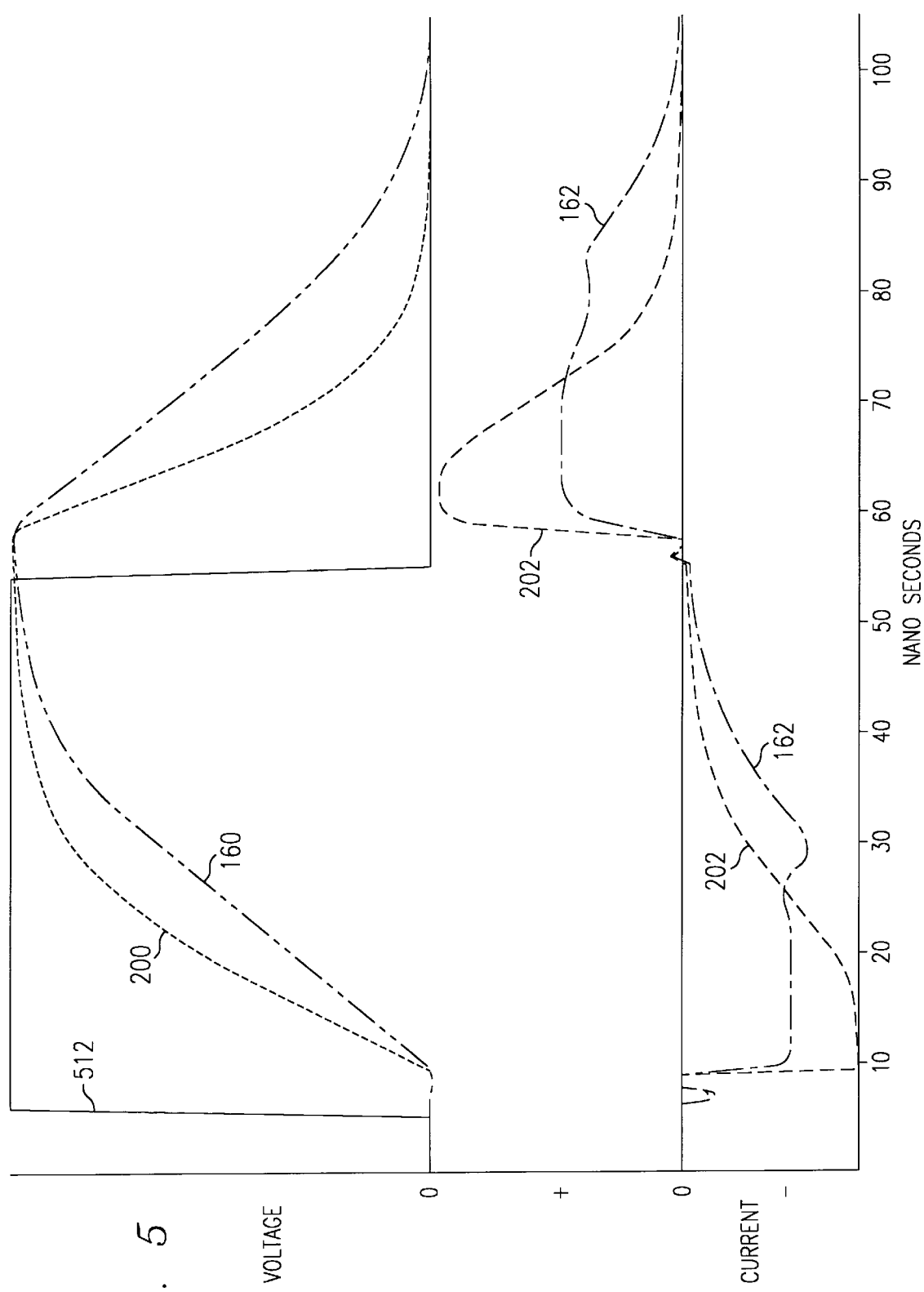
FIG. 5 is a timing diagram of the output buffer of FIG. 2 showing the output voltage and current signals.

As discussed above, an aspect of the present invention recognizes that for a given circuit implementation, output capacitance 170 connected to output terminal 160 is fixed. The energy required during transition to charge/discharge this capacitance is fixed. This energy can be supplied by a high peak current for a short period as shown by prior art output current 202 in FIG. 5, or a small peak current for a longer period as shown by output current 162 in FIG. 5. Increasing the length of time to charge the output capacitance causes a lower slew rate in output signal 560, as compared to prior art output signal 200. According to the present invention, the maximum peak current is controlled during transitions of the signal on output terminal 160 to minimize the amount of electrical noise on VCC terminal 355 and VDD terminal 345 to thereby minimize the amount of EMI radiated from and conducted by PCB traces connected to terminals 355 and 345.

Figure 6:
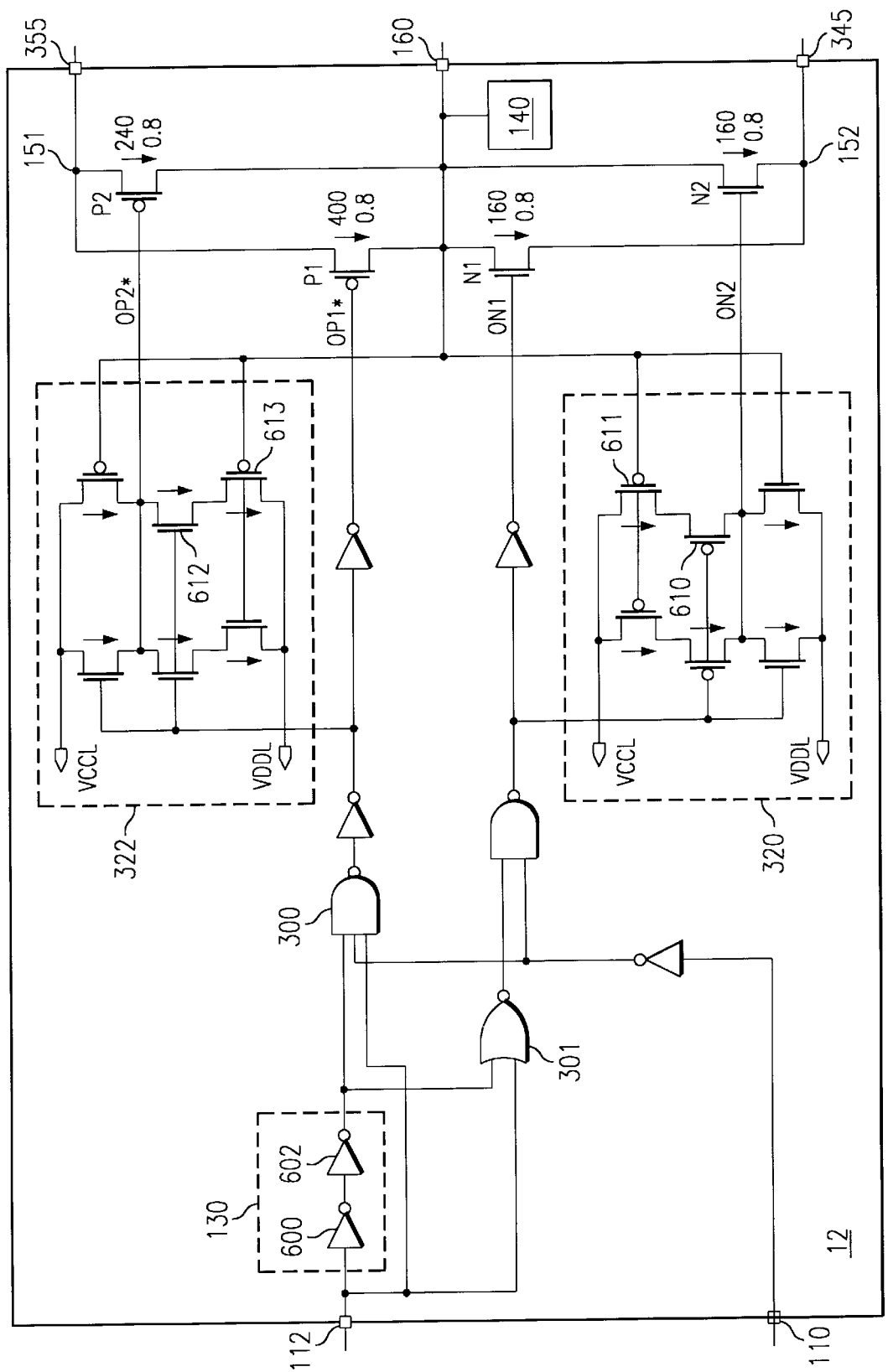
FIG. 6 is an alternate embodiment of an output buffer having slew rate control according to the present invention.

Referring to FIG. 6, an alternate embodiment of the present invention is illustrated. Output buffer 12 of FIG. 6 is designed to switch faster than output buffer 10 of FIG. 3. Output transistors N1, N2, P1, and P2 are wider and/or have shorter channels in FIG. 6 than those in FIG. 2. Transient control 130 of FIG. 6 is implemented as delay elements 600 and 602. Transient control 130 operates by connecting both signal 512 and a delayed version of signal 512 to NAND gate 300 and NOR gate 301. Level detectors 320 and 322 contain additional transistors 610–611 for reducing pull-up resistance and 612–613 for reducing pull-down resistance, respectively, so that control signals ON2 and OP2* can be asserted more rapidly than the corresponding signals in FIG. 3.

Another embodiment of the present invention comprises an inverting buffer in which an output signal switches LOW when an input signal switches HIGH, and vice versa.

Another embodiment of the present invention comprises additional NMOS output transistors and/or additional PMOS output transistors in output stage 150 which may be controlled with delayed control signals according to the present invention to further modify the slew rate of an output signal.

Another embodiment of the present invention comprises other types of output transistors, such as bipolar transistors, high voltage MOS transistors, etc.

Transient control 130 may use other types of delay elements, such as a non-inverting buffer, a delay line, an R/C circuit, a long conductor, etc.

Level detectors 320 and 322 may be implemented in various manners, including having fixed or variable threshold levels. These level detectors may be replaced with a fixed or a variable delay element so that an output transistor is turned on after a period of time rather than when an output signal has reached a predetermined threshold voltage.

Integrated circuit 5 may have one or more buffers which are constructed according to the present invention. Furthermore, integrated circuit 5 may also have other circuitry which forms the signals which are presented to the buffers, or the buffers may be discrete buffers which receive input signals from an external source.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An integrated circuit having a buffer for driving a signal, said buffer comprising:

a plurality of pull up output transistors connected between a first supply terminal and an output terminal, each of said pull up output transistors having a control terminal;

a plurality of pull down output transistors connected between a second supply terminal and said output terminal, each of said pull down output transistors having a control terminal;

an input terminal for receiving an input signal connected to a pull up slew rate control circuit and to a pull down slew rate control circuit;

said pull up slew rate control circuit forming a plurality of pull up control signals, such that a different one of said pull up control signals is connected to said control terminal of each of said plurality of pull up output transistors, wherein said pull up slew rate control circuit is operational to insert a delay between asserting each of said plurality of pull up control signals so that said pull up output transistors are selectively switched on in response to a first transition of said input signal on said input terminal;

said pull down slew rate control circuit forming a plurality of pull down control signals, such that a different one of said pull down control signals is connected to said control terminal of each of said plurality of pull down output transistors, wherein said pull down slew rate control circuit is operational to insert a delay between asserting each of said plurality of pull down control signals so that said pull down output transistors are selectively switched on in response to a second transition of said input signal on said input terminal;

transient control circuitry connected to said pull up slew rate control circuit and to said pull down slew rate control circuit being operational to delay asserting any of said plurality of pull up control signals until all of said plurality of pull down control signals are deasserted;

said transient control circuitry further operational to delay asserting any of said plurality of pull down control signals until all of said plurality of pull up control signals are deasserted; and wherein said transient control circuitry comprises:

a first feedback delay element connected between one of said plurality of pull down control signals and said pull up slew rate control circuit; and a second feedback delay element connected between one of said plurality of pull up control signals and said pull down slew rate control circuit.

2. The integrated circuit of claim 1, wherein:

said pull up slew rate control circuitry comprises at least one level detector connected to said output terminal;

said pull up slew rate control circuit is operational to assert a first pull up control signal in response to said first transition of said input signal; and said pull up slew rate control circuit is operational to delay assertion of a second pull up control signal until said level detector determines an output signal on said output terminal has reached a predetermined voltage level.

3. The integrated circuit of claim 1, wherein the first feedback delay element comprises an inverter.

4. The integrated circuit of claim 1, wherein each of said plurality of pull down output transistors are approximately the same channel size.

5. A method for reducing switching transients in a buffer circuit for driving a load having capacitive or tungsten characteristics, comprising the steps of:

providing said buffer circuit with a plurality of pull up output transistors and a plurality of pull down output transistors;

sizing each of said plurality of pull up output transistors to have a current carrying capacity which is less than a rated output source current of said buffer circuit;

turning on a first pull up output transistor of said plurality of pull up output transistors in response to a first transition of an input signal to begin supplying an output current to an output terminal at a controlled rate for a first period of time to begin charging said load;

turning on a second pull up output transistor of said plurality of output transistors after said first period of time to maintain said output current at an approximately constant value for a second period of time as said load is further charged;

turning off all of said plurality of pull up output transistors in response to a second transition of said input signal;

inserting a delay after said second transition before asserting any of said pull down output transistors, whereby a transient current through any of said plurality of pull up output transistors and any of said plurality of pull down output transistors is prevented; and wherein the step of inserting a delay comprises forming a delayed copy of a first control signal from one of said pull up output transistors and then feeding back said delayed copy of said first control signal to prevent assertion of a second control signal to any of said plurality of pull down transistors until after said first control signal is deasserted, such that the step of turning on said first pull up output transistor is not delayed by the step of inserting a delay.

6. The method of claim 5, further comprising the step of comparing a voltage on said output terminal to a predetermined high threshold voltage and performing said step of turning on said second pull up output transistor when said voltage on said output terminal is approximately equal to said predetermined high threshold voltage.

7. The method of claim 5, further comprising the step of sizing each of said plurality of pull down output transistors to have a current carrying capacity which is less than a rated output source current of said buffer circuit, wherein the current carrying capacity of each of said plurality of pull down output transistors is approximately the same.

* * * * *